US010705789B2

(12) United States Patent
Mozer (10) Patent No.: US 10,705,789 B2
(45) Date of Patent: Jul. 7, 2020

(54) DYNAMIC VOLUME ADJUSTMENT FOR VIRTUAL ASSISTANTS (71) Applicant: Sensory, Incorporated, Santa Clara, CA (US)

(72) Inventor: Todd F. Mozer, Los Altos Hills, CA (US)

(73) Assignee: Sensory, Incorporated, Santa Clara, CA (US)

( * ) Notice: Subject to any disclaimer, the term of this patent is extended or adjusted under 35 U.S.C. 154(b) by 0 days.

(21) Appl. No.: 16/045,560

(22) Filed: Jul. 25, 2018

(65) Prior Publication Data

US 2020/0034108 A1 Jan. 30, 2020

(51) Int. Cl.
| | |
|---|---|
| G10L 15/00 | (2013.01) |
| G06F 3/16 | (2006.01) |
| G10L 15/22 | (2006.01) |
| G10L 25/84 | (2013.01) |
| G06Q 50/26 | (2012.01) |
| G10L 15/08 | (2006.01) |
| G10L 13/00 | (2006.01) |
| G10L 13/10 | (2013.01) |
| G10L 13/033 | (2013.01) |
| G10L 25/21 | (2013.01) |

(52) U.S. Cl.
CPC ........... *G06F 3/165* (2013.01); *G06Q 50/265* (2013.01); *G10L 13/00* (2013.01); *G10L 15/08* (2013.01); *G10L 15/22* (2013.01); *G10L 25/84* (2013.01); *G10L 13/033* (2013.01); *G10L 13/10* (2013.01); *G10L 25/21* (2013.01); *G10L 2015/088* (2013.01); *G10L 2015/223* (2013.01)

(58) Field of Classification Search
None
See application file for complete search history.

(56) References Cited

U.S. PATENT DOCUMENTS

| 6,577,998 B1* | 6/2003 | Yamamoto | G10L 21/06 |
| | | | 704/205 |
| 9,318,101 B2* | 4/2016 | Tofighbakhsh | G10L 13/08 |
| 9,965,247 B2* | 5/2018 | Jarvis | G06F 3/167 |
| 2003/0167167 A1* | 9/2003 | Gong | G10L 15/22 |
| | | | 704/250 |
| 2006/0122840 A1* | 6/2006 | Anderson | G10L 13/033 |
| | | | 704/275 |

(Continued)

*Primary Examiner* — Richard Z Zhu
(74) *Attorney, Agent, or Firm* — Fountainhead Law Group PC (57) ABSTRACT Techniques for implementing dynamic volume adjustment by a virtual assistant are provided. In one embodiment, the virtual assistant can receive a voice query or command from a user, recognize the content of the voice query or command, process the voice query or command based on the recognized content, and determine an auditory response to be output to the user. The virtual assistant can then identify a plurality of criteria for automatically determining an output volume level for the response, where the plurality of criteria including content-based criteria and environment-based criteria, calculate values for the plurality of criteria, and combine the values to determine the output volume level. The virtual assistant can subsequently cause the auditory response to be output to the user at the determined output volume level.

16 Claims, 5 Drawing Sheets (56) References Cited

U.S. PATENT DOCUMENTS

| | | | | |
|---|---|---|---|---|
| 2006/0229873 A1* | 10/2006 | Eide | ............... | G10L 13/027 |
| | | | | 704/260 |
| 2009/0204410 A1* | 8/2009 | Mozer | ............... | G10L 15/30 |
| | | | | 704/275 |
| 2011/0096137 A1* | 4/2011 | Baker | ............... | H04N 7/147 |
| | | | | 348/14.08 |
| 2014/0172953 A1* | 6/2014 | Blanksteen | ......... | H04W 4/043 |
| | | | | 709/203 |
| 2016/0173049 A1* | 6/2016 | Mehta | ............... | H03G 3/32 |
| | | | | 381/57 |
| 2017/0161319 A1* | 6/2017 | Venkataraman | ........ | G10L 15/22 |
| 2017/0329766 A1* | 11/2017 | Matsuyama | ............ | G06F 13/00 |
| 2018/0310100 A1* | 10/2018 | Raghavan | ............... | H04R 5/04 |
| 2018/0341643 A1* | 11/2018 | Alders | ............... | G10L 21/0364 |
| 2018/0349093 A1* | 12/2018 | McCarty | ............... | G06F 3/165 |

\* cited by examiner

DYNAMIC VOLUME ADJUSTMENT FOR VIRTUAL ASSISTANTS

BACKGROUND

In recent years, voice-based virtual assistants (referred to herein as simply "virtual assistants") have become a popular feature on electronic devices such as smartphones, smart speakers, media streaming devices, televisions, and so on. Generally speaking, a virtual assistant is a software program that understands natural language voice commands and can process those commands in order to complete tasks for and/or provide information to users. For instance, according to one implementation, a user can say a predefined trigger word or phrase, known as a wake word, immediately followed by a voice query or command. The virtual assistant will usually be listening for the wake word in an always-on modality. Upon detecting an utterance of the wake word, the virtual assistant can recognize the follow-on voice query or command (e.g., "what is the weather today?" or "play music by Michael Jackson") using a combination of speech recognition and artificial intelligence (AI) techniques. The virtual assistant can then act upon the voice query/command and return a verbal response, if appropriate, to the user (e.g., "today will be mostly sunny with a high of 82 degrees" or "ok, now playing Thriller by Michael Jackson").

Typically, the volume level of a virtual assistant's sound output is set manually by a user based on the environment in which the virtual assistant is used. For example, if the virtual assistant is used in a relatively quiet environment such as a home, the user may set the virtual assistant's sound output to a low volume level. While this manual approach for volume adjustment is functional, it can be cumbersome if the acoustic conditions surrounding the virtual assistant and/or its user change often. In these scenarios, the user will need to frequently adjust the virtual assistant's volume level so that it suitable for current conditions (i.e., loud enough to be heard, but not too loud).

SUMMARY

Techniques for implementing dynamic volume adjustment by a virtual assistant are provided. In one embodiment, the virtual assistant can receive a voice query or command from a user, recognize the content of the voice query or command, process the voice query or command based on the recognized content, and determine an auditory response to be output to the user. The virtual assistant can then identify a plurality of criteria for automatically determining an output volume level for the response, where the plurality of criteria including content-based criteria and environment-based criteria, calculate values for the plurality of criteria, and combine the values to determine the output volume level. The virtual assistant can subsequently cause the auditory response to be output to the user at the determined output volume level.

A further understanding of the nature and advantages of the embodiments disclosed herein can be realized by reference to the remaining portions of the specification and the attached drawings.

DETAILED DESCRIPTION

In the following description, for purposes of explanation, numerous examples and details are set forth in order to provide an understanding of specific embodiments. It will be evident, however, to one skilled in the art that certain embodiments can be practiced without some of these details, or can be practiced with modifications or equivalents thereof.

1. Overview

The present disclosure is directed to techniques that can be implemented by a virtual assistant for dynamically adjusting the volume level of its sound output based on a combination of criteria. In various embodiments, these criteria can include a calculated importance of a message being spoken by the virtual assistant, the distance between the device implementing the virtual assistant and its user, the ambient noise level, and more.

With these techniques, there is no need for the user to manually adjust the virtual assistant's volume in response to, e.g., environmental changes. Instead, the virtual assistant itself can automate this process in a precise and optimal manner, resulting in an improved user experience.

The foregoing and other aspects of the present disclosure are described in further detail in the sections that follow.

2. System Environment

Figure 1:
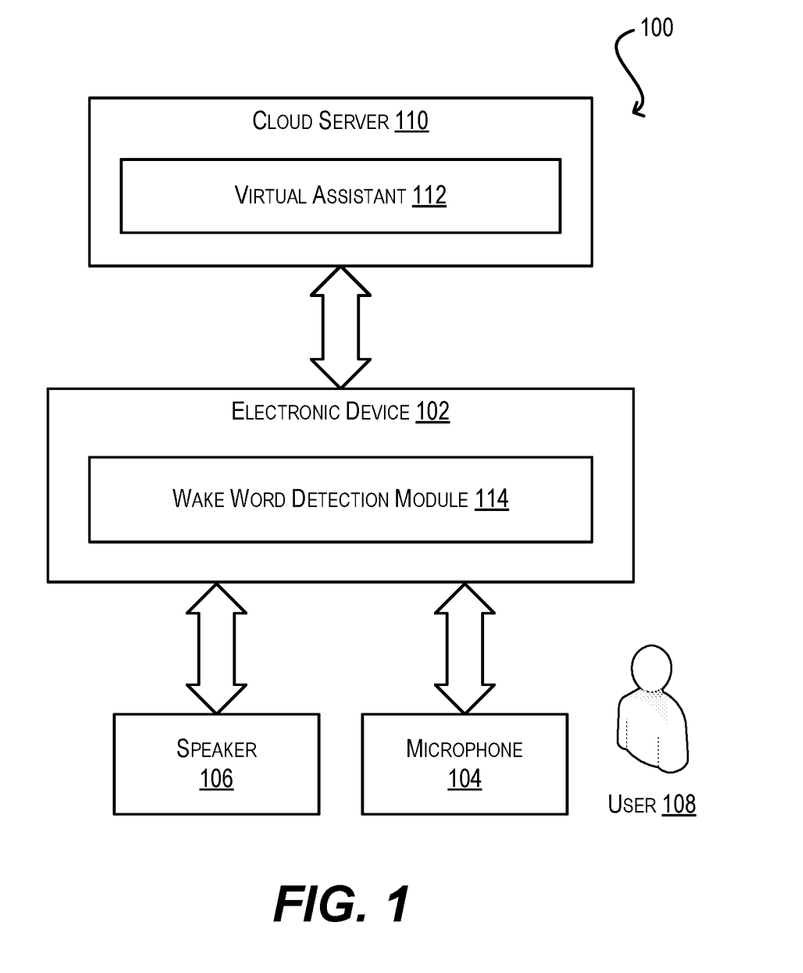
FIG. 1 depicts a system environment.

FIG. 1 depicts a system environment 100 in which embodiments of the present disclosure may be implemented. As shown, system environment 100 includes an electronic device 102 that is communicatively coupled with a microphone 104 and a speaker 106. In one set of embodiments, electronic device 102 can be a handheld or wearable device, such as a smartphone, a tablet, a smartwatch, or the like. In other embodiments, electronic device 102 can be a larger or stationary device or system, such as a smart speaker, a laptop or desktop computer, a television, a media streaming device, a video game console, a kiosk, an in-vehicle computer system, a home automation or security system, or the like.

Microphone 104 is operable for capturing audio signals from its surrounding environment, such as speech uttered by a device user 108. Speaker 106 is operable for outputting audio from electronic device 102, such as audio signals generated locally on device 102 or audio signals received from one or more remote systems/servers (e.g., cloud server 110). In one embodiment, microphone 104 and speaker 106 can be integrated directly into the physical housing of electronic device 102. In other embodiments, microphone 104 and/or speaker 106 may be resident in another device or housing that is separate from electronic device 102. For example, in a scenario where electronic device 102 is a home automation or security system, microphone 104 and speaker 106 may be placed at different locations or in different fixtures in a home. In this and other similar scenarios, audio data captured via microphone 104 and audio data output via speaker 106 can be relayed to/from electronic device 102 via an appropriate communications link (e.g., a wired or wireless link).

In addition to the foregoing components, system environment 100 further includes a virtual assistant 112. In the example of FIG. 1, virtual assistant 112 is shown as running on cloud server 110, but in other embodiments virtual assistant 112 may run wholly or partially on electronic device 102. Examples of existing virtual assistants include Siri (developed by Apple Inc.) and Alexa (developed by Amazon). According to one conventional approach, a wake word detection module 114 residing on electronic device 102 can continuously monitor for the utterance of a wake word by device user 108 via microphone 104. If module 114 detects the wake word as being spoken, electronic device 102 can capture one or more follow-on voice queries/commands uttered by device user 108 and forward the voice queries/commands to virtual assistant 112. Virtual assistant 112 can then process the voice queries/commands, determine an auditory response if appropriate (such as a verbal message, a tone, a song, etc.), and transmit the response to electronic device 102. Finally, electronic device 102 can output the response to device user 108 via speaker 106.

As mentioned previously, one challenge with implementing a virtual assistant is that the acoustic conditions under which users interact with the virtual assistant can change over relatively short periods of time. For example, if the virtual assistant is accessed via a smart speaker that is placed at a fixed location within a home (e.g., on a coffee table in the living room), a user may move around the home, and thus move closer to and/or farther away from the smart speaker, as he/she interacts with the virtual assistant. As another example, the ambient noise level around the smart speaker can go up and down (e.g., when a television in the living room is turned on or off). These changing acoustic conditions can in some cases make it difficult for the user to hear the auditory responses that the virtual assistant provides, and in other cases make the virtual assistant's sound output too loud. It is possible for the user to manually adjust the virtual assistant's volume level as needed, but having to make such manual volume adjustments on a frequent basis is cumbersome and thus undesirable from a usability perspective.

Figure 2:
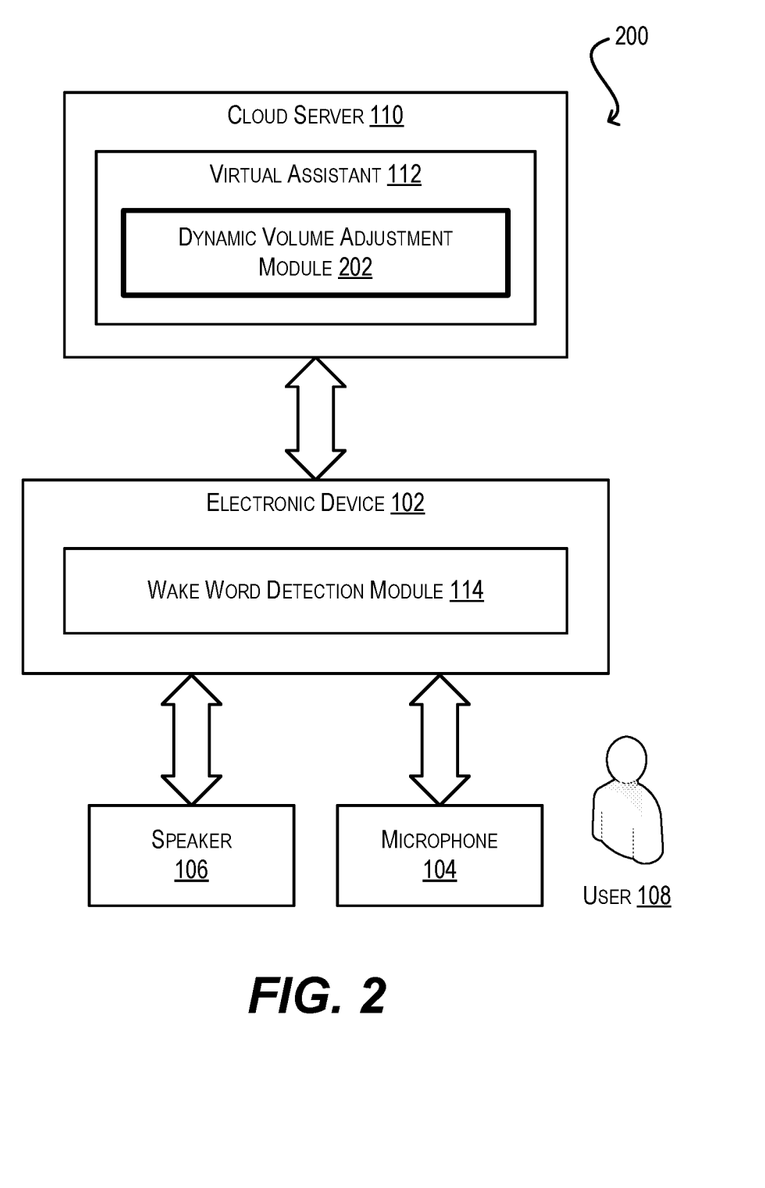
FIG. 2 depicts a system environment that implements the techniques of the present disclosure according to an embodiment.

To address the foregoing and other similar issues, FIG. 2 depicts an enhanced version of system environment 100 (i.e., system environment 200) that includes, as part of virtual assistant 112, a novel dynamic volume adjustment module 202. Dynamic volume adjustment module 202 may be implemented in software, hardware, or a combination thereof. As described in further detail below, dynamic volume adjustment module 202 can automatically adjust the sound output volume level of virtual assistant 112 by taking into account a combination of criteria, such as criteria pertaining to the content of the message being output, criteria pertaining to the most current acoustic conditions/environment surrounding electronic device 102 and/or device user 108, and so on. In this way, module 202 can advantageously ensure that device user 108 is able to hear the responses generated by virtual assistant 112 at an appropriate volume level at all times, without requiring any manual adjustments by the user.

It should be appreciated that system environment 200 of FIG. 2 is illustrative and not intended to limit embodiments of the present disclosure. For example, although dynamic volume adjustment module 202 is shown as running on cloud server 110, in some embodiments module 202 may be implemented on electronic device 102. Further, the various entities shown in FIG. 2 may include subcomponents or functions that are not explicitly described. One of ordinary skill in the art will recognize other variations, modifications, and alternatives.

3. High-Level Workflow

Figure 3:
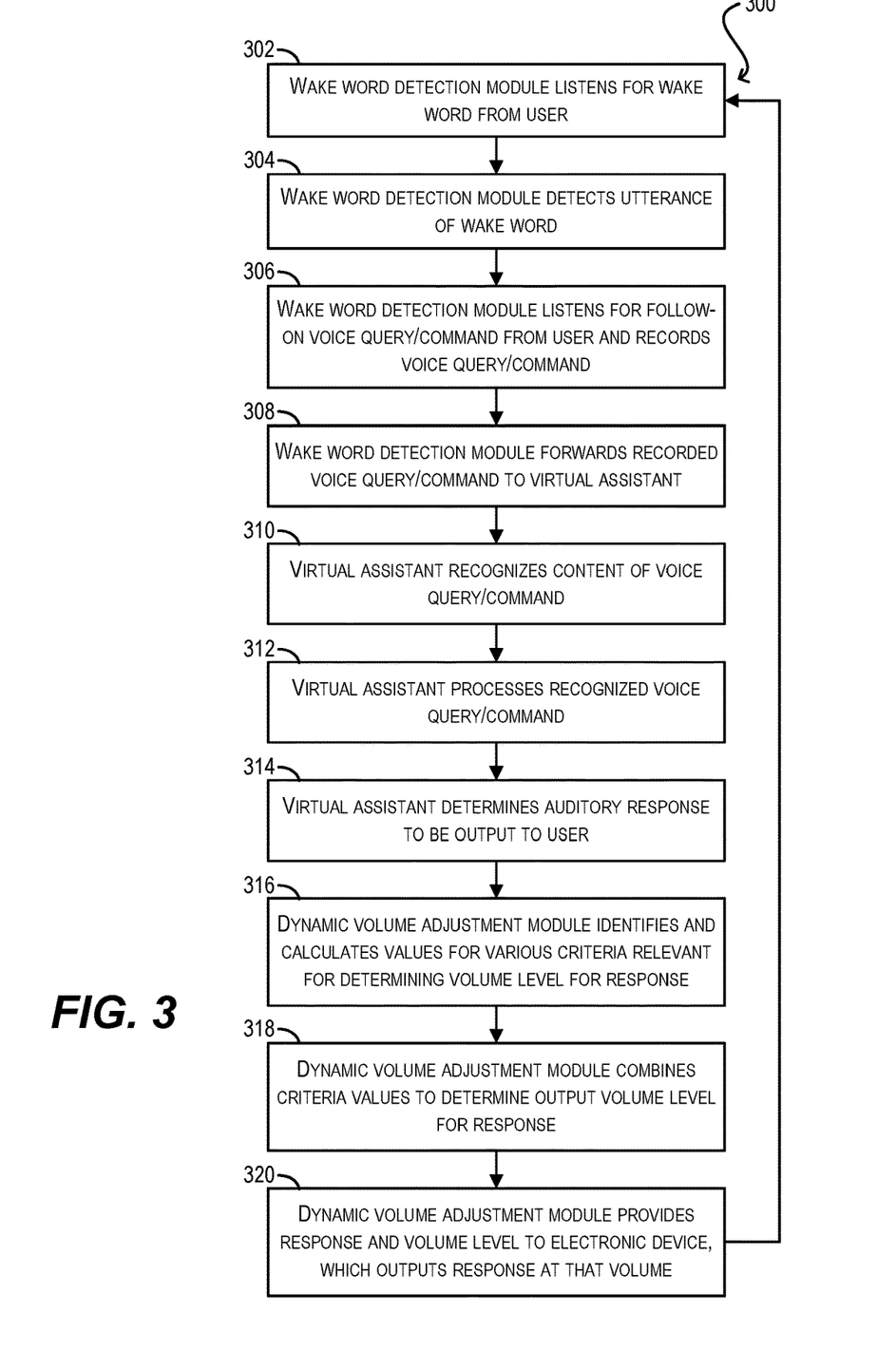
FIG. 3 depicts a high-level workflow for implementing dynamic volume control for a virtual assistant according to an embodiment.

FIG. 3 depicts a high-level workflow 300 that can be executed by virtual assistant 112 and dynamic volume adjustment module 202 of FIG. 2 for recognizing/processing a user voice query or command and outputting a response at a dynamically determined volume level according to an embodiment.

Starting with block 302, wake word detection module 114 can listen for the wake word configured for triggering virtual assistant 112. Upon detecting an utterance of the wake word by, e.g., device user 108 (block 304), wake word detection module 114 can listen for a follow-on voice query/command from device user 108, record the voice query/command (block 306), and forward the recorded voice query/command to virtual assistant 112 (block 308).

At block 310, virtual assistant 112 can recognize the content of the voice query/command using speech recognition and AI techniques. Virtual assistant 112 can then process the recognized voice query/command (block 312). For example, if the voice query/command is a request to perform a task, such as setting an alarm, virtual assistant 112 can execute the requested task. This may involve, e.g., interacting with one or more other software services/components. Alternatively, if the voice query/command is a request to retrieve a piece of information, such as current weather conditions, virtual assistant 112 can retrieved the requested information by, e.g., accessing an online data repository or search engine.

Upon processing the voice query/command, virtual assistant 112 can determine an auditory response to be output to device user 108 (block 314). For example, the auditory response may be a verbal message replying to/acknowledging the voice query/command, a tone, a piece of music, or some other sound. Virtual assistant 112 can then invoke dynamic volume adjustment module 202, which can identify and calculate values for various criteria that module 202 deems relevant for determining an appropriate volume level for the response (block 316).

The specific types of criteria that dynamic volume adjustment module 202 considers at block 316 can vary according to the implementation. For instance, according to one set of embodiments, module 202 can identify and calculate values for one or more content-based criteria that pertain to the content of the response message. One example of a content-based criterion is the importance of the response message content, where messages of higher importance are assigned a higher value (and thus higher volume level) than messages of lower importance. For this criterion, as part of block 316, dynamic volume adjustment module 202 can execute a sub-process that involves (1) recognizing the content of the response message, (2) classifying the message content according to one of several predefined content types, (3) identifying an importance level associated with the content type, and (4) assigning a value to the response based on the importance level.

The specific mappings between importance levels and content types may be defined by the developer of virtual assistant 112 and/or by end-users. In a particular embodiment, messages requesting the confirmation of actions that may affect user privacy or cost money (e.g., external messaging or financial/purchase transactions) and messages that alert the user to potentially dangerous conditions (e.g., detection of a home intrusion, presence of smoke, etc.) can be assigned a relatively high importance level, while messages that simply repeat or acknowledge the user's original voice query/command can be assigned a relatively low importance level.

Another example of a content-based criterion is the identity of the user being spoken to (i.e., device user 108). This criterion covers scenarios where some users may prefer a higher general volume level (e.g., older users that are hard-of-hearing), while other users may prefer a lower general volume level. For this criterion, as part of block 316, dynamic volume adjustment module 202 can execute a sub-process that involves (1) recognizing the identity of device user 108 based on, e.g., his/her voice (and/or other biometric factors, such as face, fingerprint, etc.), (2) retrieving a preferred volume level mapped to the identified user, and (3) assigning a value to the response based on the preferred user volume level.

In addition to (and/or in lieu of) content-based criteria, dynamic volume adjustment module 202 can also take into account environment-based criteria that pertain to the environmental conditions around electronic device 102 and/or device user 108 at the time the voice query/command was submitted. One example of an environment-based criterion is how far device user 102 is located from speaker 106 of electronic device 102. For this criterion, as part of block 316, dynamic volume adjustment module 202 can execute a sub-process that involves (1) calculating the distance between device user 102 and speaker 106 using, e.g., computer vision, echo-location, radar, or known techniques, and (2) assigning a value to the response based on the calculated distance.

Another example of an environment-based criterion is the ambient noise level around electronic device 102. For this criterion, as part of block 316, dynamic volume adjustment module 202 can execute a sub-process that involves (1) determining the ambient noise level via microphone 104 and (2) assigning a value to the response based on the determined ambient noise level.

It should be appreciated that the criteria noted above are exemplary and that other types of criteria that may be relevant for automated volume level determination are within the scope of the present disclosure.

Once dynamic volume adjustment module 202 has calculated values for all relevant criteria at block 316, module can combine the criteria values to arrive at a final output volume level for the response (block 318). In certain embodiments, this step can include weighting each criteria value using a developer or user-defined weight. For example, if device user 108 feels that his/her preferred volume level setting should take priority over other types of criteria, user 108 can define a high weight for the "user identity" criterion described above, which will strongly bias the final volume determination based on the user's preferred volume level.

Finally, at block 320, virtual assistant 112 can provide the response and volume level to electronic device 102, which can output the response via speaker 106 at the specified volume. Workflow 300 can then return to block 302 in order to listen for and process additional user voice queries/commands.

4. Dynamic Feedback/Learning Loop

Workflow 300 of FIG. 3 is a static process in that, for a given set of inputs (e.g., importance level of response message content type, user identity, distance between user and device, ambient noise level, criteria weights, etc.), dynamic volume adjustment module 202 will always calculate the same volume level for outputting a response. However, in some scenarios, device user 108 may wish to train the behavior of module 202 in a dynamic and ongoing manner. For instance, some of the initial criteria rules or weights may be not be ideal, and thus device user 108 may want to inform virtual assistant 112 that the output volume for a given response was too loud (or too soft) and for virtual assistant 112 to learn from that feedback.

Figure 4:
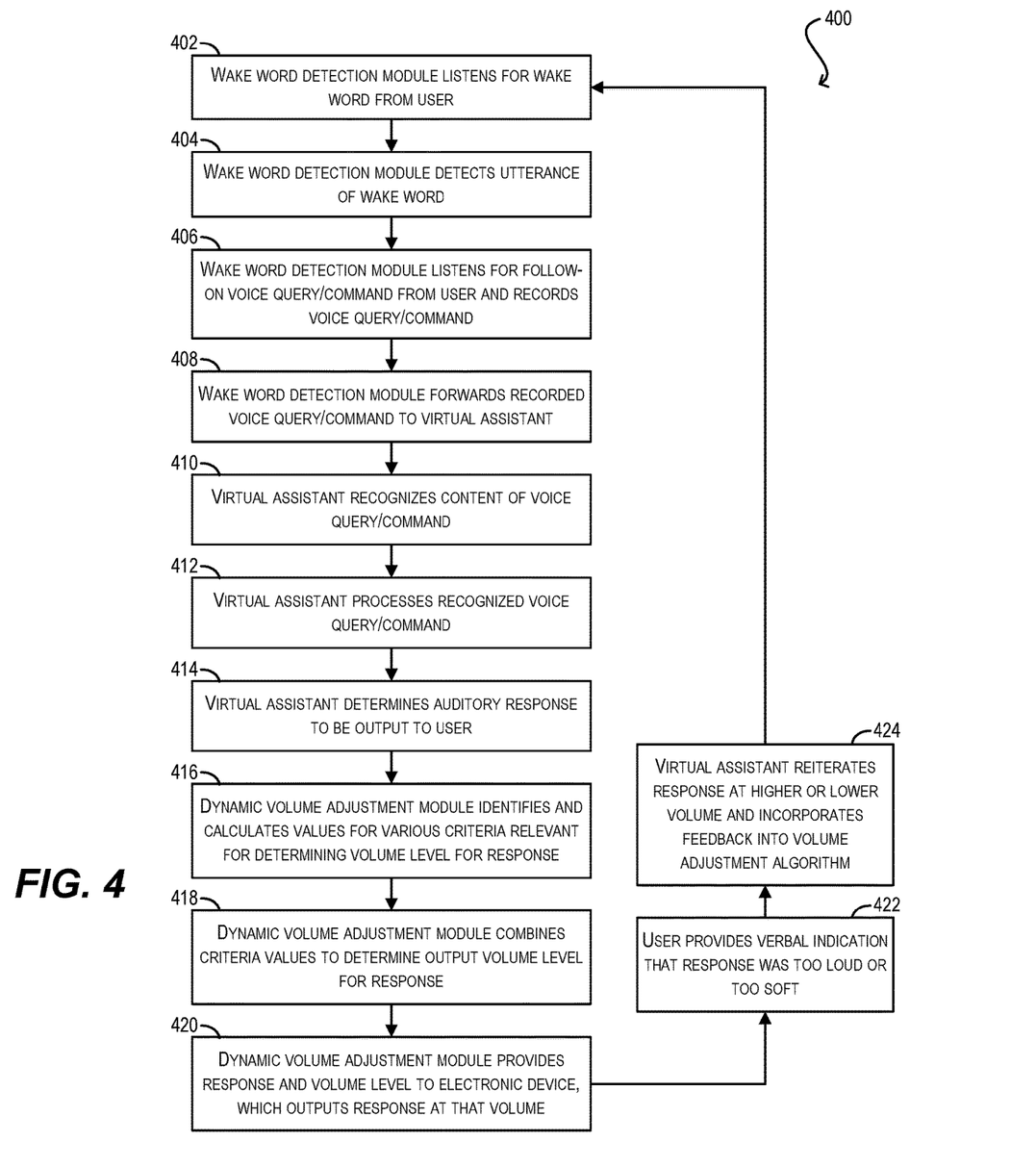
FIG. 4 depicts a modified version of the workflow of FIG. 3 that incorporates a dynamic feedback/learning loop according to an embodiment.

To address this, FIG. 4 depicts a modified version of workflow 300 (i.e., workflow 400) that implements a feedback/learning loop for dynamic volume adjustment module 202. The majority of the steps of workflow 400 are similar to those of workflow 300; however, once electronic device 102 has output the response at the calculated volume level to device user 108 (per block 420), user 108 can provide a verbal indication that the response was too loud or not loud enough (block 422). This indication can be provided to virtual assistant 112, which can reiterate the response at a higher or lower volume as needed, but also incorporate this feedback into its algorithm for calculating the volume level (block 424).

For example, if device user 108 indicates at block 422 that the volume level of the response was too loud, dynamic volume adjustment module 202 can remember this along with the inputs/criteria values used to calculate the volume level. Then, the next time the same or similar inputs/criteria values are encountered, module 202 can slightly decrease the output volume from the calculated level. In this manner, module 202 can better match its automatic volume adjustment algorithm with the user's preferences.

5. Example Computing Device

Figure 5:
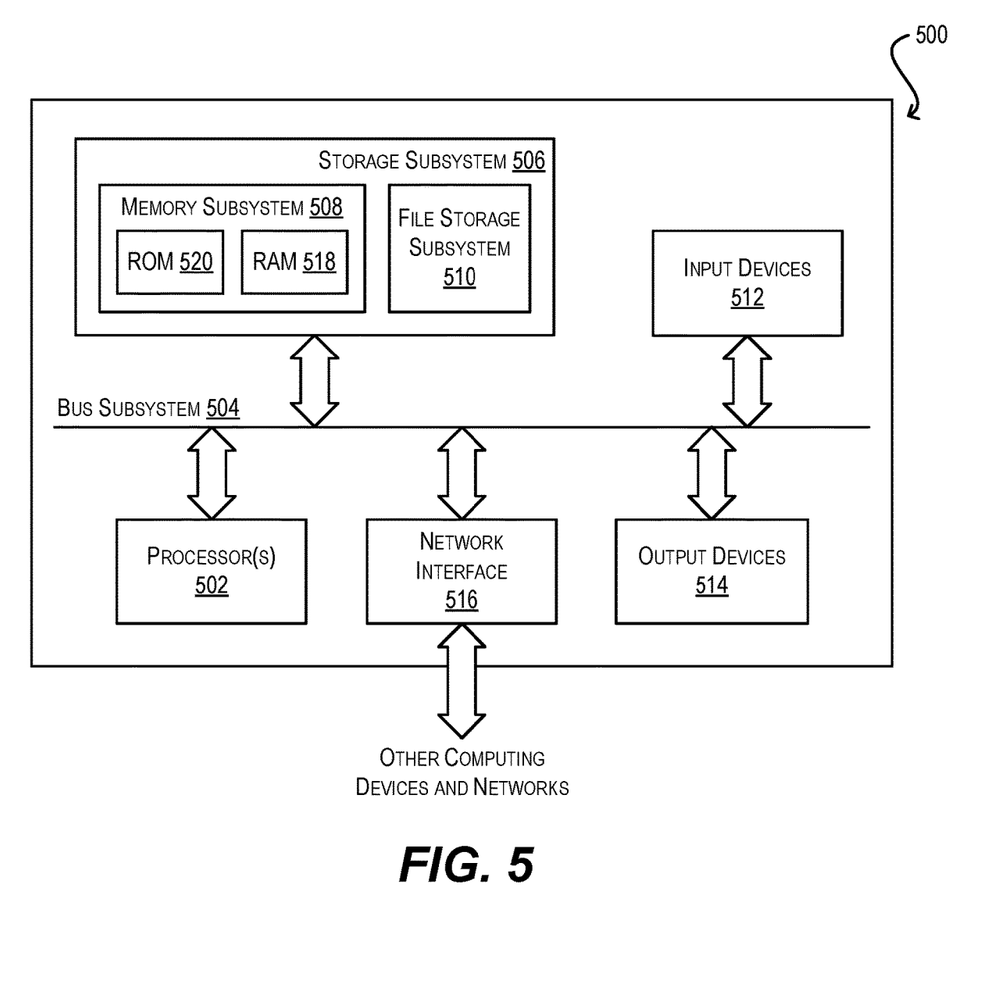
FIG. 5 depicts a computing device according to an embodiment.

FIG. 5 is a simplified block diagram of the architecture of an example computing device 500 according to an embodiment. This architecture may be used to implement electronic device 102 and/or cloud server 110 of FIGS. 1 and 2. As shown, computing device 500 includes one or more processors 502 that communicate with a number of peripheral devices via a bus subsystem 504. These peripheral devices include a storage subsystem 506 (comprising a memory subsystem 508 and a file storage subsystem 510), input devices 512, output devices 514, and a network interface subsystem 516.

Bus subsystem 504 can provide a mechanism for letting the various components and subsystems of computing device 500 communicate with each other as intended. Although bus subsystem 504 is shown schematically as a single bus, alternative embodiments of the bus subsystem can utilize multiple buses.

Network interface subsystem 516 can serve as an interface for communicating data between computing device 500 and other computing devices or networks. Embodiments of network interface subsystem 516 can include wired (e.g., coaxial, twisted pair, or fiber optic Ethernet) and/or wireless (e.g., Wi-Fi, cellular, Bluetooth, etc.) interfaces.

Input devices 512 can include a camera, a touch-screen incorporated into a display, a keyboard, a pointing device (e.g., mouse, touchpad, etc.), an audio input device (such as microphone 104 of FIG. 1), and/or other types of input devices. In general, use of the term "input device" is intended to include all possible types of devices and mechanisms for inputting information into computing device 500.

Output devices 514 can include a display subsystem (e.g., a flat-panel display), an audio output device (e.g., such as speaker 106 of FIG. 1), and/or the like. In general, use of the term "output device" is intended to include all possible types of devices and mechanisms for outputting information from computing device 500.

Storage subsystem 506 includes a memory subsystem 508 and a file/disk storage subsystem 510. Subsystems 508 and 510 represent non-transitory computer-readable storage media that can store program code and/or data that provide the functionality of various embodiments described herein.

Memory subsystem 508 can include a number of memories including a main random access memory (RAM) 518 for storage of instructions and data during program execution and a read-only memory (ROM) 520 in which fixed instructions are stored. File storage subsystem 510 can provide persistent (i.e., non-volatile) storage for program and data files and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computing device 500 is illustrative and not intended to limit embodiments of the present invention. Many other configurations having more or fewer components than computing device 500 are possible.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. For example, although certain embodiments have been described with respect to particular process flows and steps, it should be apparent to those skilled in the art that the scope of the present invention is not strictly limited to the described flows and steps. Steps described as sequential may be executed in parallel, order of steps may be varied, and steps may be modified, combined, added, or omitted.

Further, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the disclosure as set forth in the following claims.

What is claimed is:

1. A method comprising:
   receiving, by a virtual assistant, a first voice query or command from a user;
   recognizing, by the virtual assistant, content of the first voice query or command;
   processing, by the virtual assistant, the first voice query or command based on the recognized content;
   subsequently to the processing, determining, by the virtual assistant, a first auditory response to be output to the user;
   identifying, by the virtual assistant, a first plurality of criteria for automatically determining a first output volume level for the first auditory response, the first plurality of criteria including content-based criteria and environment-based criteria, the content-based criteria including an identity criterion that is based on an identity of the user;
   calculating, by the virtual assistant, a first set of values for the first plurality of criteria;
   combining, by the virtual assistant, the first set of values to determine the first output volume level;
   causing, by the virtual assistant, the first auditory response to be output to the user at the first output volume level;
   after the first auditory response has been output to the user at the first output volume level, receiving, by the virtual assistant, a verbal signal from the user that the first auditory response is too loud;
   in response to receiving the verbal indication from the user that the auditory response is too loud, saving, by the virtual assistant, the first set of values for the first plurality of criteria and an indication of the verbal signal; and
   upon receiving a second voice query or command from the user:
      determining a second auditory response to be output to the user;
      identifying a second plurality of criteria for automatically determining a second output volume level for the second auditory response;
      calculating a second set of values for the second plurality of criteria; and
      comparing the second set of values for the second plurality of criteria with the saved first set of values for the first plurality of criteria; and
      if the second set of values is determined to be substantially similar to the first set of values:
         setting the second output volume level to be lower than the first output volume level; and
         causing the second auditory response to be output to the user at the second output volume level.

2. The method of claim 1 wherein the content-based criteria pertain to the content of the first auditory response.

3. The method of claim 2 wherein the content-based criteria include an importance criterion that is based on an importance of the content.

4. The method of claim 3 wherein calculating a value for the importance criterion comprises:
   classifying the content as one of a plurality of predefined content types; and
   identifying an importance level mapped to the classified content type.

5. The method of claim 4 wherein the importance level is defined by the user.

6. The method of claim 4 wherein content types relating to user privacy or financial transactions are mapped to relatively higher importance levels.

7. The method of claim 1 wherein the environment-based criteria pertain to current auditory conditions surrounding a device implementing the virtual assistant or the user.

8. The method of claim 7 wherein the environment-based criteria include a distance criterion that is based on a distance between the device and the user.

9. The method of claim 8 wherein the distance is determined using computer vision, echo-location, or radar.

10. The method of claim 7 wherein the environment-based criteria include an ambient noise criterion that is based on an amount of ambient noise around the device or the user.

11. The method of claim 1 wherein combining the first set of values for the first plurality of criteria to determine the first output volume level comprises:
   identifying weights associated with the first plurality of criteria; and
   combining the first set of values in a manner that takes into account the weights.

12. The method of claim 11 wherein the weights are defined by the user.

13. A non-transitory computer readable medium having stored thereon program code executable by a processor of a computing device, the program code comprising:
 code that causes the processor to receive a first voice query or command from a user;
 code that causes the processor to recognize content of the first voice query or command;
 code that causes the processor to process the first voice query or command based on the recognized content;
 code that causes the processor to determine a first auditory response to be output to the user;
 code that causes the processor to identify a first plurality of criteria for automatically determining a first output volume level for the first auditory response, the first plurality of criteria including content-based criteria and environment-based criteria, the content-based criteria including an identity criterion that is based on an identity of the user;
 code that causes the processor to calculate a first set of values for the first plurality of criteria;
 code that causes the processor to combine the first set of values to determine the first output volume level;
 code that causes the processor to output the first auditory response to the user at the first output volume level;
 code that causes the processor to receive, after the first auditory response has been output to the user at the first output volume level, a verbal signal from the user that the first auditory response is too loud;
 code that causes the processor to save, in response to receiving the verbal indication from the user that the auditory response is too loud, the first set of values for the plurality of criteria and an indication of the verbal signal; and
 code that causes the processor to, upon receiving a second voice query or command from the user:
  determine a second auditory response to be output to the user;
  identify a second plurality of criteria for automatically determining a second output volume level for the second auditory response;
  calculate a second set of values for the second plurality of criteria; and
  compare the second set of values for the second plurality of criteria with the saved first set of values for the first plurality of criteria; and
  if the second set of values is determined to be substantially similar to the first set of values:
   set the second output volume level to be lower than the first output volume level; and
   cause the second auditory response to be output to the user at the second output volume level.

14. The non-transitory computer readable medium of claim 13 wherein the content-based criteria pertain to the content of the auditory response, and wherein the environment-based criteria pertain to current auditory conditions surrounding the computing device or the user.

15. A computing device comprising:
 a processor; and
 a memory having stored thereon program code which, when executed by the processor, causes the processor to:
  receive a first voice query or command from a user;
  recognize content of the first voice query or command;
  process the first voice query or command based on the recognized content;
  determine a first auditory response to be output to the user;
  identify a first plurality of criteria for automatically determining a first output volume level for the first auditory response, the first plurality of criteria including content-based criteria and environment-based criteria, the content-based criteria including an identity criterion that is based on an identity of the user;
  calculate a first set of values for the first plurality of criteria;
  combine the first set of values to determine the first output volume level;
  output the first auditory response to the user at the first output volume level;
  receive, after the first auditory response has been output to the user at the first output volume level, a verbal signal from the user that the first auditory response is too loud;
  save, in response to receiving the verbal indication from the user that the auditory response is too loud, the first set of values for the plurality of criteria and an indication of the verbal signal; and
  upon receiving a second voice query or command from the user:
   determine a second auditory response to be output to the user;
   identify a second plurality of criteria for automatically determining a second output volume level for the second auditory response;
   calculate a second set of values for the second plurality of criteria; and
   compare the second set of values for the second plurality of criteria with the saved first set of values for the first plurality of criteria; and
   if the second set of values is determined to be substantially similar to the first set of values:
    set the second output volume level to be lower than the first output volume level; and
    cause the second auditory response to be output to the user at the second output volume level.

16. The computing device of claim 15 wherein the content-based criteria pertain to the content of the auditory response, and wherein the environment-based criteria pertain to current auditory conditions surrounding the computing device or the user.

* * * * *